(12) United States Patent
Huang

(10) Patent No.: US 11,887,943 B2
(45) Date of Patent: Jan. 30, 2024

(54) SEMICONDUCTOR DEVICES, SEMICONDUCTOR DEVICE PACKAGES AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/684,375

(22) Filed: Mar. 1, 2022

(65) Prior Publication Data

US 2022/0189887 A1    Jun. 16, 2022

Related U.S. Application Data

(63) Continuation of application No. 16/696,819, filed on Nov. 26, 2019, now Pat. No. 11,264,340.

(51) Int. Cl.
*H01L 23/64*    (2006.01)
*H01L 23/00*    (2006.01)
(Continued)

(52) U.S. Cl.
CPC ........ *H01L 23/642* (2013.01); *H01L 21/4857* (2013.01); *H01L 23/49822* (2013.01); *H01L 23/49838* (2013.01); *H01L 24/16* (2013.01); *H01L 2224/16227* (2013.01); *H01L 2924/19041* (2013.01); *H01L 2924/19103* (2013.01)

(58) Field of Classification Search
None
See application file for complete search history.

(56) References Cited

U.S. PATENT DOCUMENTS 6,635,184 B1   10/2003 Cohen et al.
10,199,273 B2 * 2/2019 Kuo ................. H01L 21/76898
(Continued)

FOREIGN PATENT DOCUMENTS

JP    5374814 B2    12/2013

OTHER PUBLICATIONS

Notice of Allowance for U.S. Appl. No. 16/696,819, dated Oct. 27, 2021, 5 pages.
(Continued)

*Primary Examiner* — Long Pham
(74) *Attorney, Agent, or Firm* — FOLEY & LARDNER LLP

(57) ABSTRACT

A capacitor structure includes a first metal layer, a first metal oxide layer, a second metal oxide layer, a first conductive member, a second conductive member and a metal composite structure. The first metal layer has a first surface and a second surface opposite the first surface. The first metal oxide layer is formed on the first surface of the first metal layer. The second metal oxide layer is formed on the second surface of the first metal layer. The first conductive member penetrates through the capacitor structure and is electrically isolated from the first metal layer. The second conductive member is electrically connected to the first metal layer. The metal composite structure is disposed between the second conductive member and the first metal layer.

16 Claims, 19 Drawing Sheets

(51) Int. Cl.
  *H01L 23/498* (2006.01)
  *H01L 21/48* (2006.01)

(56) References Cited

U.S. PATENT DOCUMENTS

| | | |
|---|---|---|
| 10,540,821 B2* | 1/2020 | Musunuri ................. G06T 7/62 |
| 2007/0205520 A1 | 9/2007 | Chou et al. |
| 2011/0285022 A1 | 11/2011 | Lin et al. |
| 2013/0280881 A1 | 10/2013 | Kim et al. |
| 2015/0311117 A1* | 10/2015 | Lin ....................... H01L 23/481 |
| | | 438/653 |
| 2016/0229690 A1 | 8/2016 | Nakao et al. |

OTHER PUBLICATIONS

U.S. Office Action for U.S. Appl. No. 16/696,819, dated Jun. 8, 2021, 10 pages.

\* cited by examiner

SEMICONDUCTOR DEVICES, SEMICONDUCTOR DEVICE PACKAGES AND METHOD FOR MANUFACTURING THE SAME

CROSS-REFERENCE TO RELATED APPLICATION

This application is a continuation of U.S. patent application Ser. No. 16/696,819 filed Nov. 26, 2019, now issued as U.S. Pat. No. 11,264,340 the contents of which is incorporated herein by reference in its entirety.

BACKGROUND

1. Field of the Disclosure

The present disclosure relates to semiconductor devices, semiconductor device packages and methods thereof manufacturing the same.

2. Description of the Related Art

Capacitors are utilized in many electronic devices. It is an ongoing desire to miniaturize circuitry without loss of capability. In a semiconductor substrate with embedded components, passive components, such as capacitors, are discrete. Nowadays, suppliers can provide non-discrete capacitor components in a strip-type substrate that are semi-finished products. After burying the semi-finished product in a dielectric structure (e.g., prepreg), subsequent processes are applied to the semi-finished product to prepare electrical connection and to arrive at a capacitor structure.

When performing the burying and mechanical drilling processes to the substrates, a desmear process is performed to clean surface stains (e.g., aluminum oxide or prepreg). Afterwards, when forming copper in via holes, aluminum-copper alloy may be formed which results in the generation of voids and adversely affects the performance of the capacitor structure.

SUMMARY

In some embodiments, the present disclosure provides a capacitor structure. The capacitor structure includes a first metal layer, a first metal oxide layer, a second metal oxide layer, a first conductive member, a second conductive member and a metal composite structure. The first metal layer has a first surface and a second surface opposite the first surface. The first metal oxide layer is formed on the first surface of the first metal layer. The second metal oxide layer is formed on the second surface of the first metal layer. The first conductive member penetrates through the capacitor structure and is electrically isolated from the first metal layer. The second conductive member is electrically connected to the first metal layer. The metal composite structure is disposed between the second conductive member and the first metal layer.

In some embodiments, the present disclosure provides a semiconductor device package. The semiconductor device package includes a capacitor structure and a first redistribution layer (RDL). The capacitor structure includes a first metal layer, a first metal oxide layer, a second metal oxide layer, a first conductive member, a second conductive member and a metal composite structure. The first metal layer has a first surface and a second surface opposite the first surface. The first metal oxide layer is formed on the first surface of the first metal layer. The second metal oxide layer is formed on the second surface of the first metal layer. The first conductive member penetrates through the capacitor structure and is electrically isolated from the first metal layer. The second conductive member is electrically connected to the first metal layer. The metal composite structure is disposed between the second conductive member and the first metal layer. The RDL is disposed on a top surface of the capacitor structure.

In some embodiments, the present disclosure provides a method for manufacturing a capacitor structure. The method includes providing a multi-layer structure, forming a first opening, forming a dielectric layer, forming a first conductive member, forming a second opening and forming a metal composite structure and a second conductive member. The multi-layer structure includes a first metal layer, a first metal oxide layer disposed on a top surface of the first metal layer, and a second metal oxide layer disposed on a bottom surface of the first metal layer. The first opening penetrates through the multi-layer structure. The dielectric layer covers a top surface of the multi-layer structure, a bottom surface of the multi-layer structure and a lateral surface of the first opening. The first conductive member is formed in the first opening wherein the first conductive member is electrically isolated from the first metal layer by the dielectric layer. The second opening exposes a surface of the first metal layer. The metal composite structure and a second conductive member electrically connected to the first metal layer by the metal composite structure are formed in the second opening.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

Figure 1:
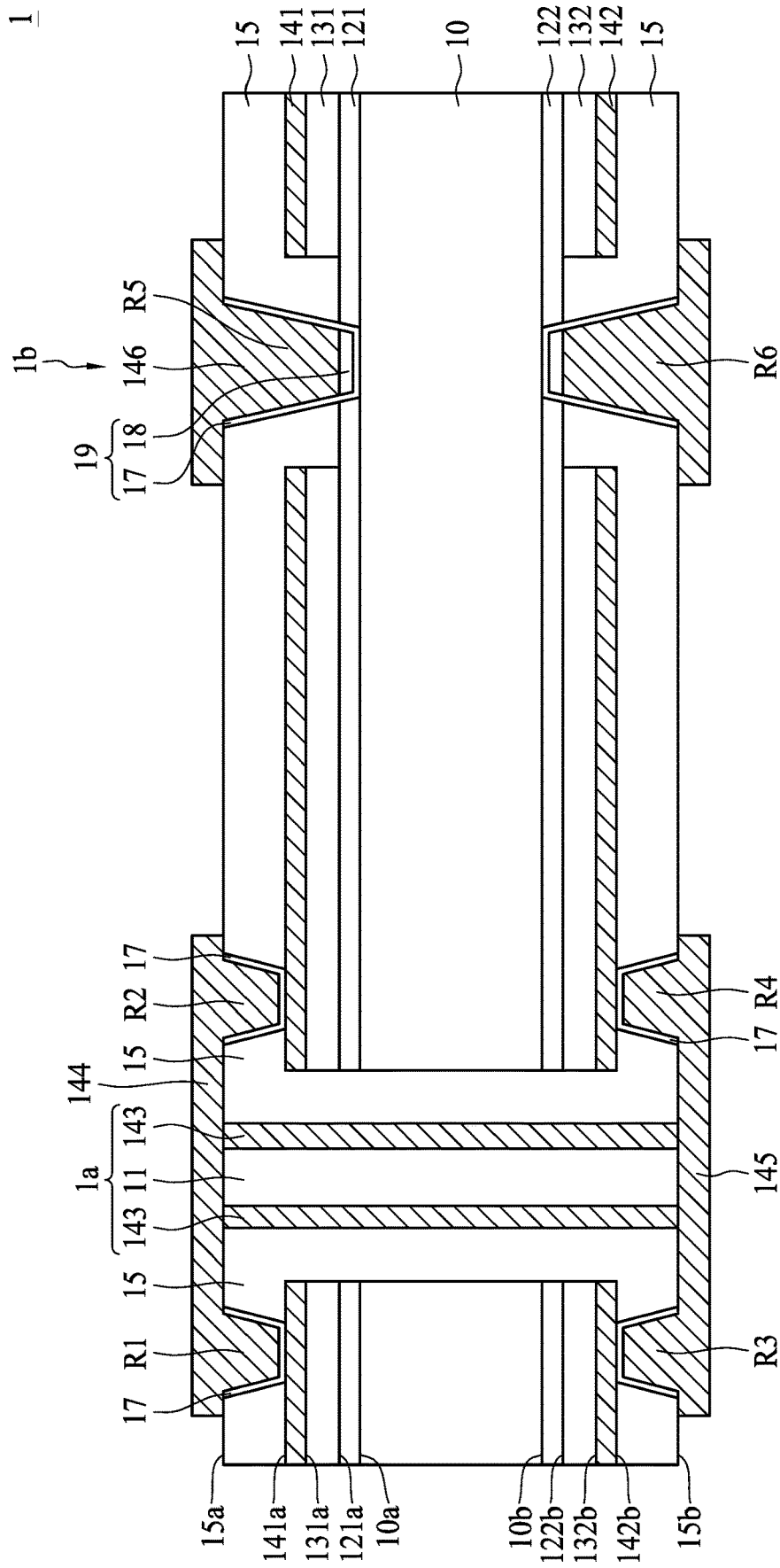
FIG. 1 illustrates a cross-sectional view of a capacitor structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a capacitor structure 1 according to some embodiments of the present disclosure.

Referring to FIG. 1, a metal layer 10 is provided. The metal layer 10 has a top surface 10a and a bottom surface 10b opposite to the top surface 10a. A metal oxide layer 121 is disposed on the top surface 10a of the metal layer 10. A metal oxide layer 122 is disposed on bottom the surface 10b of the metal layer 10. The metal layer 10 includes aluminum or other metal. The metal oxide layers 121 and 122 include aluminum oxide or other metal oxide.

The capacitor structure 1 includes an insulating layer 131 disposed on a top surface 121a of the metal oxide layer 121 and an insulating layer 132 disposed on a bottom surface 122b of the metal oxide layer 122. The insulating layers 131 and 132 may be formed of a same material or a different material. In some embodiments, the insulating layers 131 and 132 includes an ABF material or an ABF-like material.

The capacitor structure 1 further includes a metal layer 141 disposed on a top surface 131a of the insulating layer 131 and a metal layer 142 disposed on a bottom surface 132b of the insulating layer 132. A dielectric layer 15 is disposed to cover a top surface 141a of the metal layer 141, a bottom surface 142a of the metal layer 142 and a lateral surface of a conductive member 1a. The dielectric layer 15 includes polymer materials. For example, the dielectric layer 15 may include a flowable dielectric material in a hardened or semi-hardened state, such as a liquid crystal polymer, a resin with pre-impregnated fibers (e.g., a prepreg), Ajinomoto Buildup Film (ABF), a resin, an epoxy material, or other flowable dielectric material in a hardened or semi-hardened state.

The conductive member 1a (e.g., conductive via) penetrates through the capacitor structure 1 (e.g., from the top surface 15a of the dielectric layer 15 to the bottom surface 15b of the dielectric layer 15). The conductive member 1a is electrically isolated from the metal layer 10, for example, by the dielectric layer 15. The dielectric layer 15 surrounds a lateral surface of the conductive member 1a. In some embodiments, the conductive member 1a includes a metal layer 143 and a dielectric layer 11. The dielectric layer 11 fills a center of the conductive member 1a and is surrounded by the metal layer 143.

One or more recesses R1 and R2 are formed in the dielectric layer 15 to expose the top surface 141a of the metal layer 141. One or more recesses R3 and R4 are formed in the dielectric layer 15 to expose the bottom surface 142a of the metal layer 142. A seed layer 17 is formed in the recesses R1, R2, R3 and R4. A metal layer 144 is formed on a top surface 15a of the dielectric layer 15 and in contact with a top surface of the conductive member 1a. The metal layer 144 extends to the one or more recesses R1 and R2 and is in contact with the seed layer 17 therein. Similarly, a metal layer 145 is formed on a bottom surface 15b of the dielectric layer 15 and in contact with a bottom surface of the conductive member 1a. The metal layer 145 extends to the one or more recesses R3 and R4 and is in contact with the seed layer 17 therein. In some embodiment, the seed layer 17 is made of metal or alloys. For example, the seed layer 17 may include titanium and copper. The metal layer 145 may include trace(s), pad(s), via(s), etc.

In some embodiments, the conductive member 1a may taper from the top surface of the conductive member 1a to the bottom of the conductive member 1a or from the bottom of the conductive member 1a to the top surface of the conductive member 1a. In some embodiments, the conductive member 1a may resemble the shape of an hourglass.

The capacitor structure 1 includes a conductive member 1b electrically connected to the metal layer 10. The conductive member 1b is a blind via which penetrates the capacitor structure 1 and is in contact with a metal composite structure 19. The conductive member 1b includes a metal layer 146. A recess R5 is formed to expose the surface 10a of the metal layer 10. A seed layer 17 (e.g., metal adhesive layer) is disposed in the recess R5 and covers a lateral side wall of the recess R5 and the bottom of the recess R5. A barrier layer 18 is disposed on the seed layer 17 in the recess R5. The barrier layer 18 together with the metal adhesive layer 17 constitute a metal composite structure 19 which is disposed between the conductive member 1b and the metal layer 10. The metal layer 146 is formed on a top surface 15a of the dielectric layer 15 and has an extension in contact with the seed layer 17 and the barrier layer 18 in the recess R5. The metal layer 145 may include trace(s), pad(s), via(s), etc. Similarly, a conductive member 1b and metal composite structure 19 are formed in the recess R6.

As showed in FIG. 1, a portion of the surface 10a of the metal layer 10 is exposed from the metal oxide layer 121 and defines the recess R5 together with the metal oxide layer 121 and the dielectric layer 15. A portion of the surface 10b of the metal layer 10 is exposed from the metal oxide layer 122 and defines the recess R6 together with the metal oxide layer 122 and the dielectric layer 15. A metal composite structure 19 is disposed in each of the recesses R5 and R6. The metal composite structure 19 includes the metal adhesive layer 17 and the barrier layer 18. The barrier layer 18 is formed between the metal adhesive layer 17 and the conductive member 1b. The metal adhesive layer 17 is formed between the barrier layer 18 and the metal layer 10.

The recesses R5 and R6 are blind via holes. The recesses R5 and R6 are formed to penetrate the dielectric layer 15 and the metal oxide layer 121 or 122 to the metal layer 10, for example, by laser drilling. The blind via hole R5 is tapered. The blind via hole R6 is tapered. At least one of the conductive member 1a and the conductive member 1b is tapered and/or has an hourglass shape.

In some embodiments, the barrier layer 18 includes one of Ti, TiN, Ta, TaN, WTi, Co, Ni and Pt. A thickness of the barrier layer 18 is in a range of about 1000 to about 2000 angstrom, for example, 1000 angstrom, 1100 angstrom, 1200 angstrom, 1300 angstrom, 1400 angstrom, 1500 angstrom, 1600 angstrom, 1700 angstrom, 1800 angstrom, 1900 angstrom, or 2000 angstrom. The barrier layer 18 is disposed between the metal layer 10 and the metal layer 146 to avoid generation of voids on the interface between the metal layer 10 and the metal layer 146.

In some embodiments, the metal adhesive layer 17 has an oxidation reduction potential in a range between an oxidation reduction potential of the barrier layer 18 and an oxidation reduction potential of the metal layer 10. In some embodiments, the metal adhesive layer 17 includes one of Mn, Zn, Fe, Cd, and Co. In some embodiments, the metal adhesive layer 17 includes Ti and Cu.

In some embodiments, the metal adhesive layer 17 includes Ti and Cu and the barrier layer 18 includes Ni.

Figure 2:
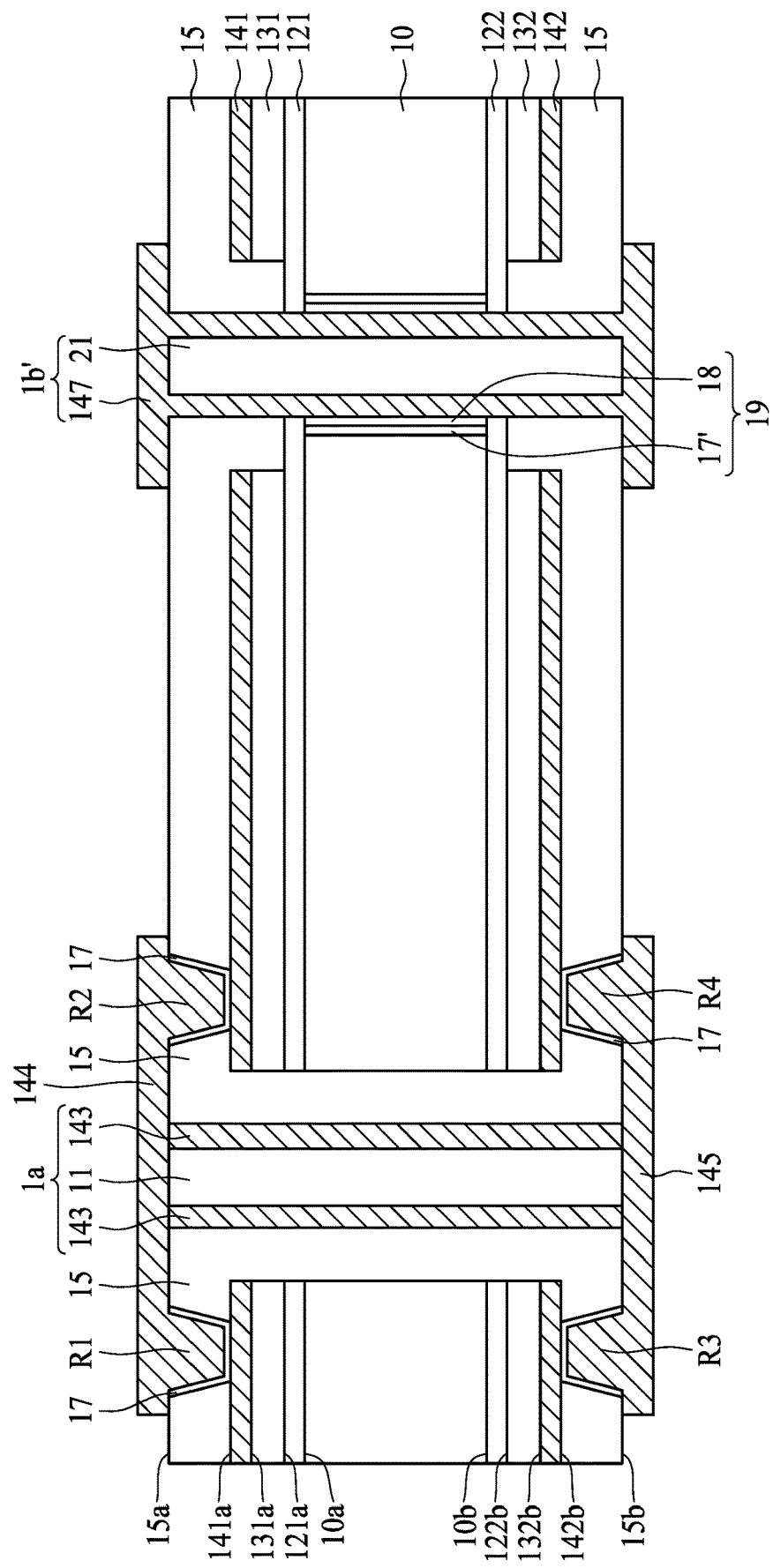
FIG. 2 illustrates a cross-sectional view of another capacitor structure according to some embodiments of the present disclosure.

FIG. 2 illustrates a cross-sectional view of a capacitor structure 2 according to some embodiments of the present disclosure. The capacitor structure 2 of FIG. 2 has a similar structure to that of the capacitor structure 1 of FIG. 1 except the configuration of the conductive member 1b' and the metal composite structure 19.

A conductive member (e.g., conductive via) 1b' penetrates through the capacitor structure 2 (e.g., from the top surface 15a of the dielectric layer 15 to the bottom surface 15b of the dielectric layer 15). In some embodiments, the conductive member 1b' may taper from the top surface of the conductive member 1b' to the bottom of the conductive member 1b' or from the bottom of the conductive member 1b' to the top surface of the conductive member 1b'. In some embodiments, the conductive member 1b' may resemble the shape of an hourglass.

The conductive member 1b' includes the metal layer 147 and the dielectric layer 21. The dielectric layer 21 fills a center of the conductive member 1a and is surrounded by the metal layer 147. A metal composite structure 19 is formed between the metal layer 10 and the metal layer 147. The metal composite structure 19 is disposed in a recess defined by the metal oxide layer 121, the metal oxide layer 122 and a lateral surface of the metal layer 10. The metal composite structure 19 includes a barrier layer 18 and a metal adhesive layer 17'. The barrier layer 18 is formed between the metal adhesive layer 17' and the conductive member 2b. The metal adhesive layer 17' is formed between the barrier layer 18 and the metal layer 10.

The metal composite structure 19 is disposed between a lateral surface of the conductive member 2b and a lateral surface of the metal layer 10. The conductive member 2b is electrically connected to the metal layer 10.

In some embodiments, the barrier layer 18 includes one of Ti, TiN, Ta, TaN, WTi, Co, Ni and Pt. A thickness of the barrier layer 18 is in a range of about 1000 to about 2000 angstrom, for example, 1000 angstrom, 1100 angstrom, 1200 angstrom, 1300 angstrom, 1400 angstrom, 1500 angstrom, 1600 angstrom, 1700 angstrom, 1800 angstrom, 1900 angstrom, or 2000 angstrom. The barrier layer 18 is disposed between the metal layer 10 and the metal layer 147 to avoid generation of voids on the interface between the metal layer 10 and the metal layer 147.

In some embodiments, the metal adhesive layer 17' has an oxidation reduction potential in a range between an oxidation reduction potential of the barrier layer 18 and an oxidation reduction potential of the metal layer 10. In some embodiments, the metal adhesive layer 17' includes one of Mn, Zn, Fe, Cd, and Co.

In some embodiments, the metal adhesive layer 17' includes Zn and the barrier layer 18 includes Ni.

The metal layers 141, 142, 143, 144, 145, 146 and 147 may be made of a same material or different material, for example, copper or other metal, or metal alloy, or other conductive material.

In comparative embodiments, the metal layer 10 (e.g., aluminum) is in direct contact with the metal layer 146 of the conductive member 1b or the metal layer 147 of the conductive member 1b'. The metal layer 146 or 147 (e.g., copper) may form an alloy with the metal layer 10 which generates undesired voids in the structure. In the embodiments according to the present disclosure, a barrier layer 18 is formed between the metal layer 146 or 147 and the metal layer 10 which prevents from the diffusion of metal atom from one metal layer to another metal layer. In addition, a metal adhesive layer 17 or 17' is disposed between the metal layer 10 and the metal layer 10, which further improves the adhesion therebetween. For example, when the metal layer 10 is aluminum and the barrier layer 18 is nickel, since the oxidation reduction potentials of aluminum and nickel are significantly different, the binding of aluminum and copper is poor and peeling easily occurs. Therefore, an electroless plated metal (e.g., zinc) can be used between aluminum and nickel as a metal adhesive layer (a further operation of replacement of zinc and nickel may be optionally carried out), which can avoid peeling. After the replacement, the thickness of remaining zinc may be equal to or less than 0.5 μm and the thickness of remaining nickel may be about in the range of 3 to 5 μm.

Figure 3:
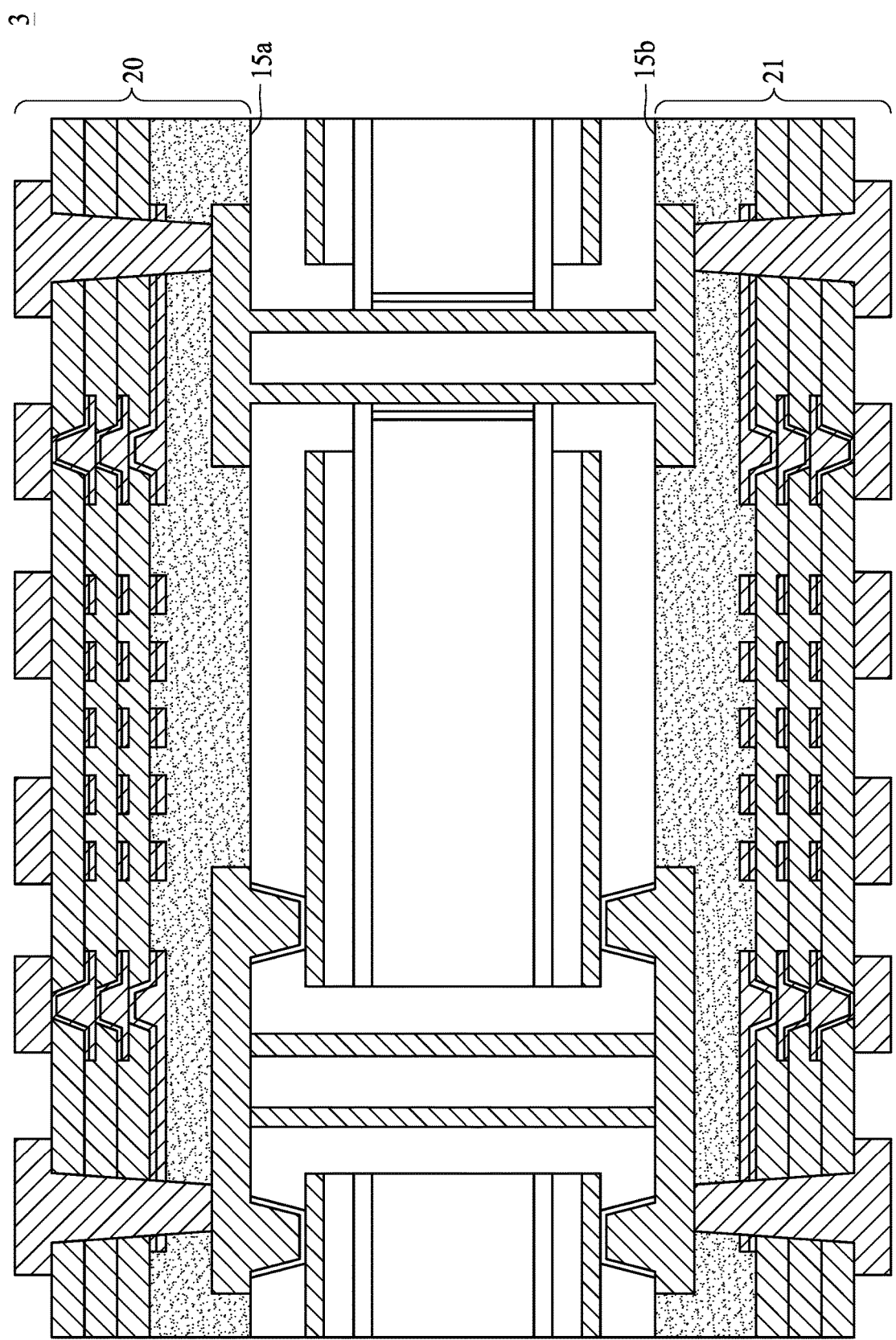
FIG. 3 illustrates a cross-sectional view of another capacitor structure according to some embodiments of the present disclosure.

The capacitor structure 2 is in a strip form. The capacitor structure 2 may have additional wiring structure thereon. FIG. 3 illustrates a cross-sectional view of a capacitor structure 3 according to some embodiments of the present disclosure. A redistribution layer (RDL) structure 20 is disposed on a surface 15a of the capacitor structure 2 as shown in FIG. 2. In some embodiments, the line width/line space (L/S) of the RDL structure 20 is equal to or less than 10 μm/10 μm, for example, in a range of 0.5 μm/0.5 μm to 10 μm/10 μm (e.g., 0.5 μm/0.5 μm, 1 μm/1 μm, 2 μm/2 μm, 3 μm/3 μm, 4 μm/4 μm, 5 μm/5 μm, 6 μm/6 μm, 7 μm/7 μm, 8 μm/8 μm, 9 μm/9 μm or 10 μm/10 μm). An RDL structure 21 is disposed on a surface 15b of the capacitor structure 2 as shown in FIG. 2. The line width/line space (L/S) of the RDL structure 21 is larger than 10 μm/10 μm, for example, equal to or larger than 12 μm/12 μm, equal to or larger than 14 μm/14 μm, equal to or larger than 14 μm/14 μm, equal to or larger than 15 μm/15 μm, etc.

Figure 4:
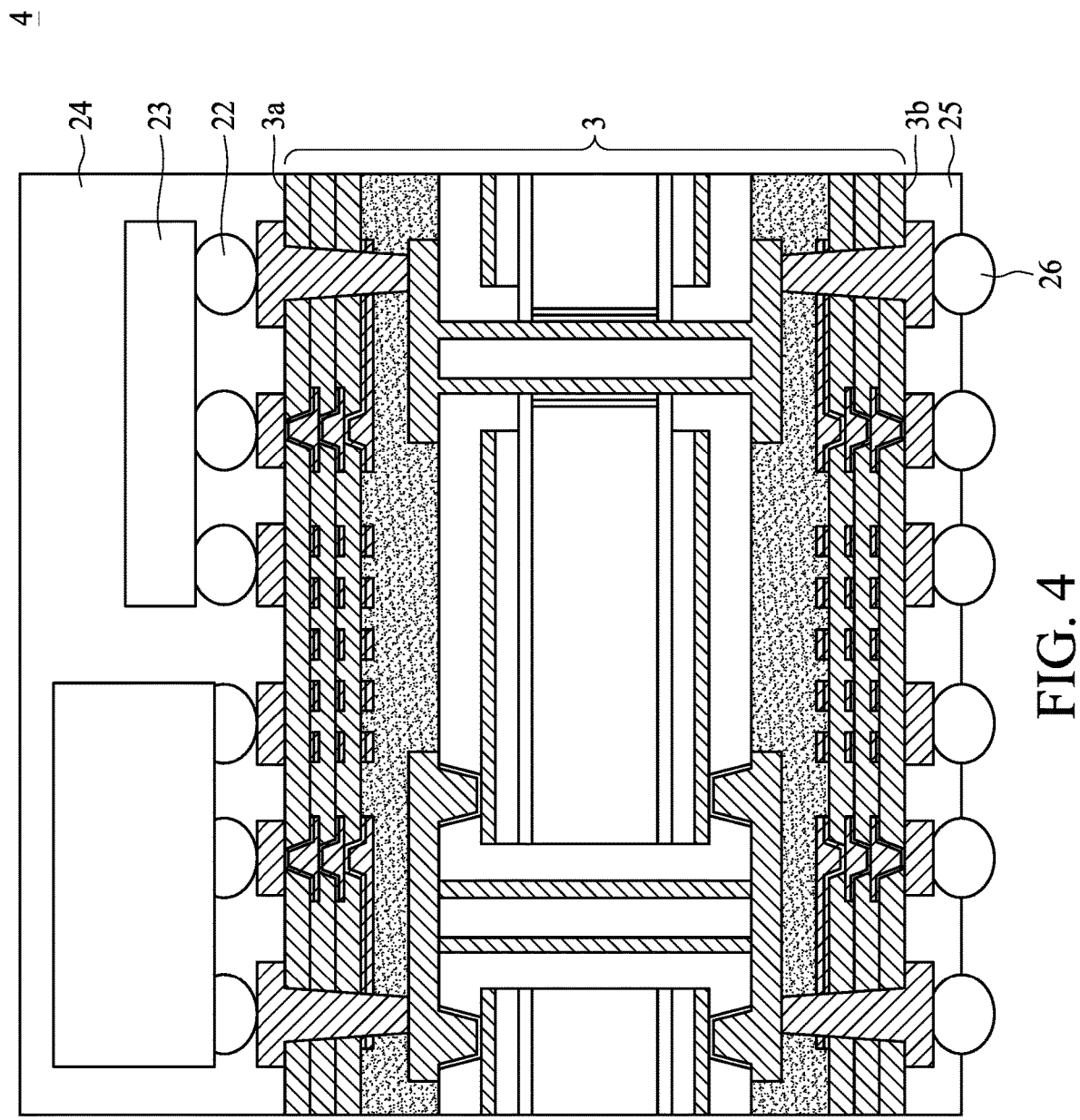
FIG. 4 illustrates a cross-sectional view of a semiconductor device package according to some embodiments of the present disclosure.

FIG. 4 illustrates a cross-sectional view of a semiconductor device package 4 according to some embodiments of the present disclosure. In FIG. 4 a capacitor structure 3 according to FIG. 3 is provided. One or more semiconductor devices 23 are disposed on a top surface 3a of the capacitor structure 3 and electrically connected to the RDL structure 20 (denoted in FIG. 3) via a bump material 22. An encapsulant 24 encapsulates the semiconductor devices 23 and the bump material 22 and the top surface 3a of the capacitor structure 3. A solder resist layer 25 is formed on a bottom surface 3b of the capacitor structure 3 and expose contact pads of the RDL structure 21 (denoted in FIG. 3). Solder balls 26 are disposed on the contact pads of the RDL structure 21 to form the semiconductor device package 4. Afterwards, the semiconductor device package 4 is singulated into respective chips.

FIG. 5A, FIG. 5B, FIG. 5C, FIG. 5D, FIG. 5E, FIG. 5F, FIG. 5G and FIG. 5H illustrate various stages of a method of manufacturing the capacitor structure 1 of FIG. 1.

Figure 5A:
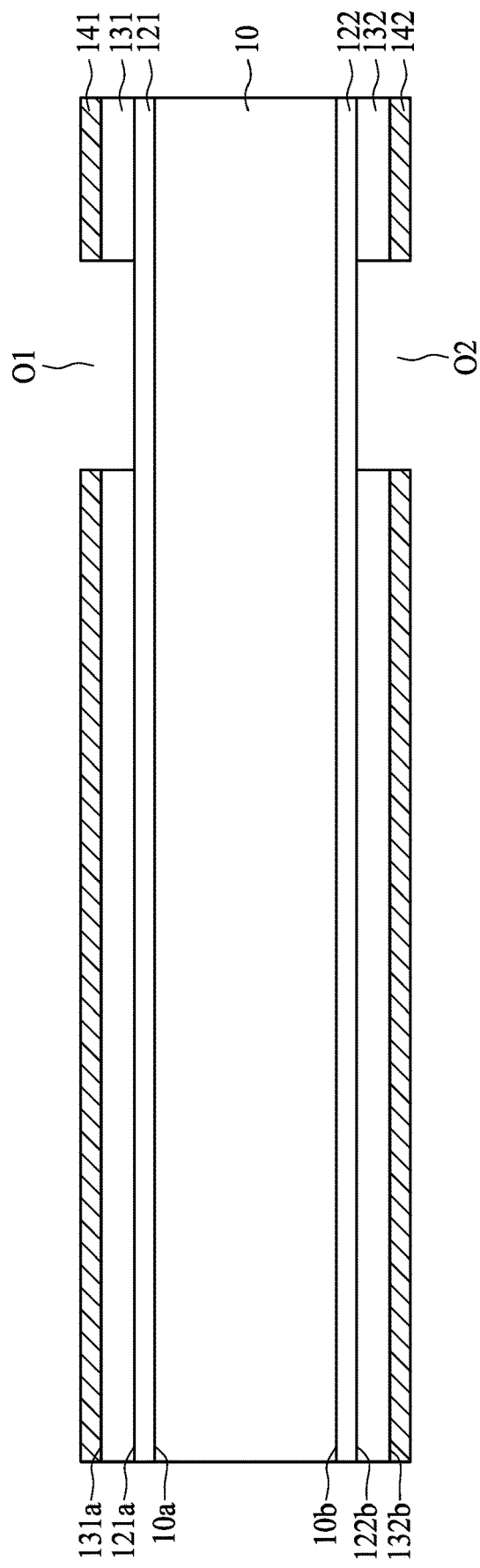
FIG. 5A, FIG. 5B, FIG. 5C, FIG. 5D, FIG. 5E, FIG. 5F, FIG. 5G and FIG. 5H illustrate various stages of a method of manufacturing a capacitor structure according to some embodiments of the present disclosure.

Referring to FIG. 5A, a multi-layer structure is provided. The multi-layer structure includes a metal layer 10, a metal oxide layer 121 and a metal oxide layer 122. The metal layer 10 comprises aluminum. The metal oxide layer 121 is disposed on a top surface 10a of the metal layer 10. The metal oxide layer 122 is disposed on a bottom surface 10b of the metal layer 10.

An insulating layer 131 is formed on a top surface 121a of the metal oxide layer 121 and an insulating layer 132 is formed on a bottom surface 121b of the metal oxide layer 122. A metal layer 141 is formed on a top surface 131a of the insulating layer 131 and a metal layer 142 is formed on a bottom surface 132 of the insulating layer 132. The metal layer 14 includes copper. An opening O1 is formed. The opening O1 passes through the metal layer 141 and the insulating layer 131 and expose the top surface 121a of the metal oxide layer 121. Another opening O2, which passes through the metal layers 142 and the insulating layer 132, may be formed to expose the bottom surface 122b of the metal oxide layer 122.

Figure 5B:
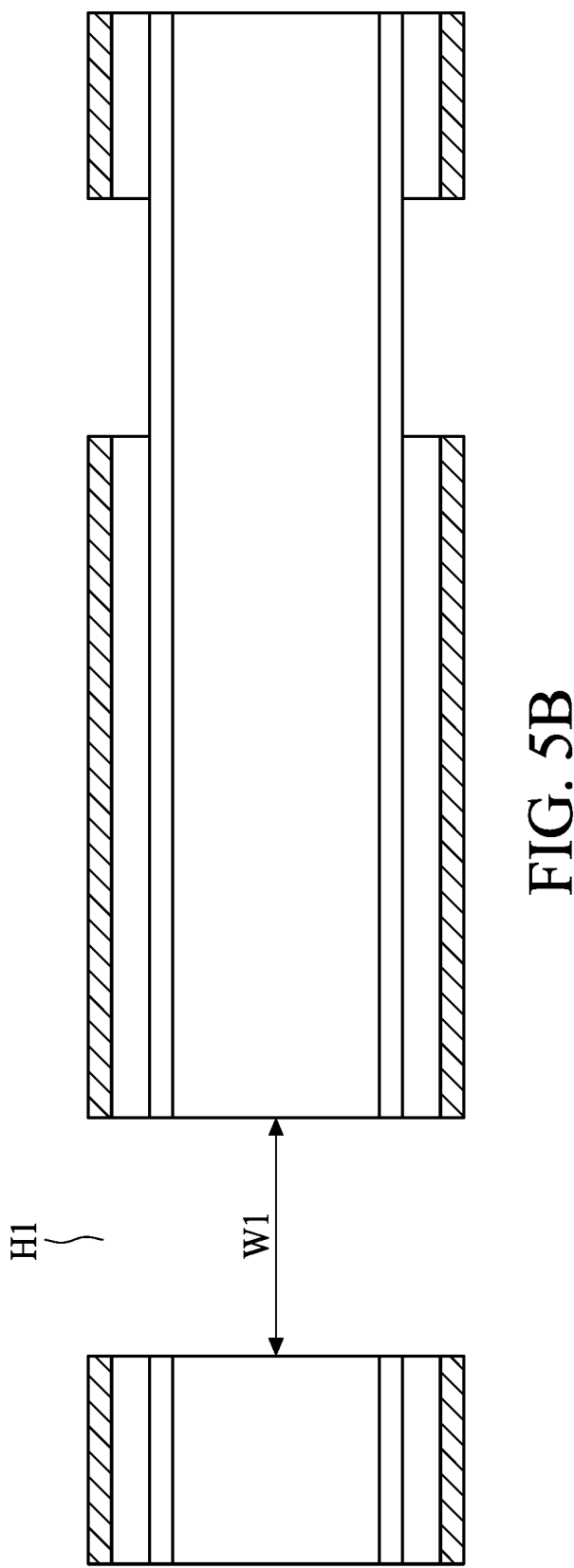
Figure 6A:
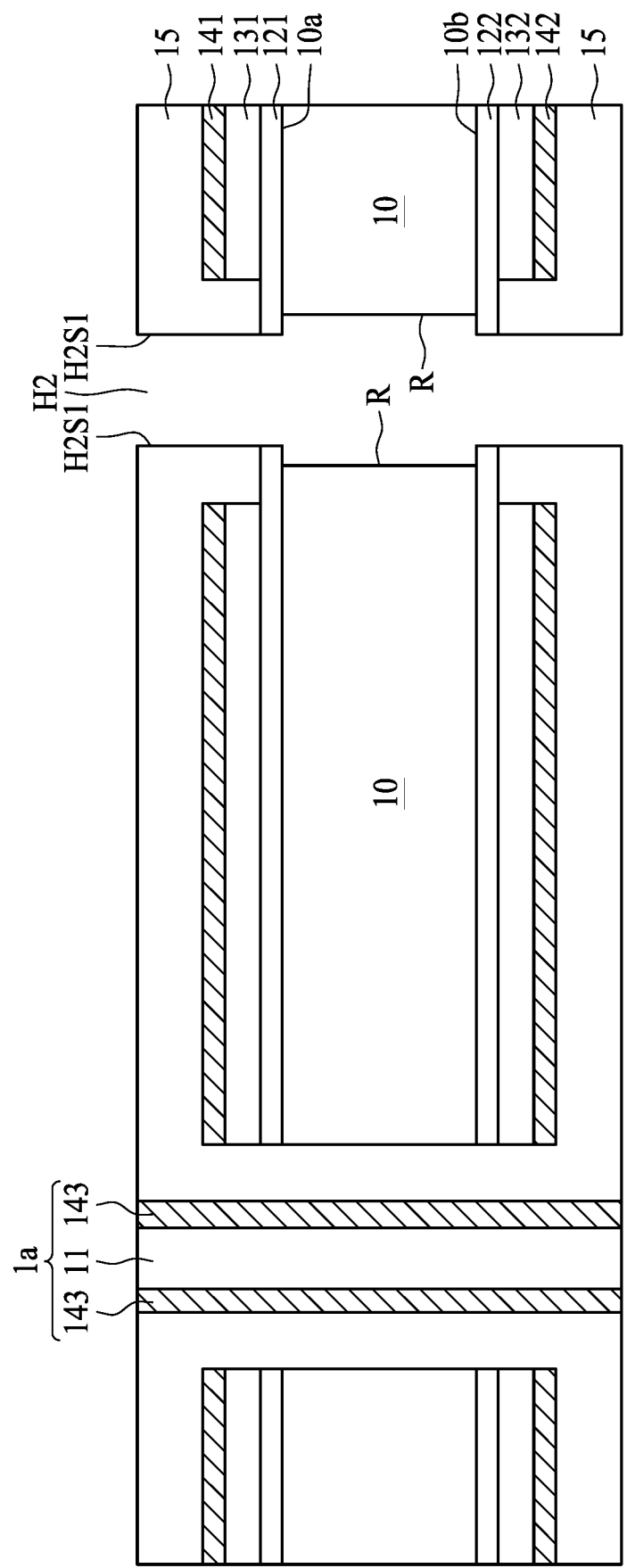
FIG. 6A, FIG. 6B, FIG. 6C, FIG. 6D, FIG. 6E, FIG. 6F and FIG. 6G illustrate various stages of a method of manufacturing a semiconductor device package according to some embodiments of the present disclosure.

Referring to FIG. 5B, an opening H1 is formed to penetrate through the multi-layer structure of FIG. 6A. The opening H1 may be formed by mechanical drilling or other techniques. The width W1 of the opening H1 may be equal to or less than 1000 µm, equal to or less than 800 µm, equal to or less than 600 µm, equal to or less than 400 µm, equal to or less than 300 µm, or equal to or less than 250 µm, etc.

Figure 5C:
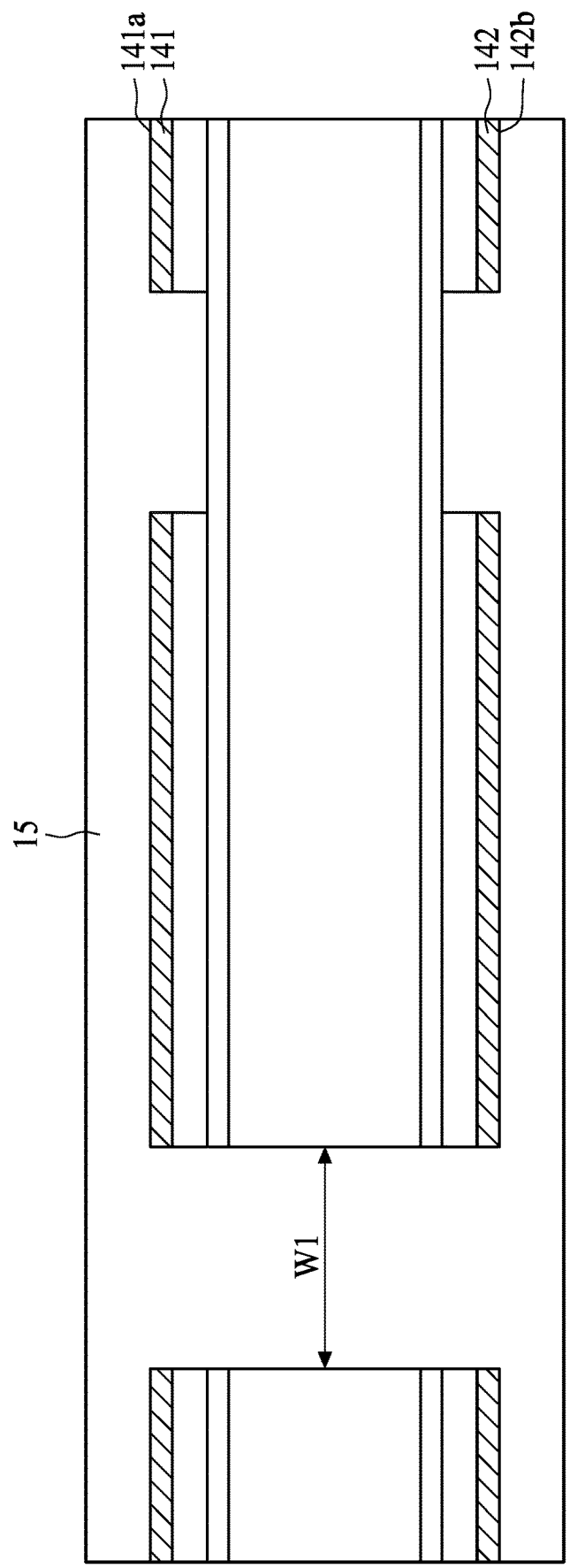

Referring to FIG. 5C, a dielectric layer 15 is formed to encapsulate the structure of FIG. 5B. The dielectric layer 15 covers a top surface 141a of the metal layer 141 of the multi-layer structure, a bottom surface 142b of the metal layer 142 of the multi-layer structure, and a lateral surface of the opening H1. In some embodiments, the opening H1 is fully filled by the dielectric layer 15.

Figure 5D:
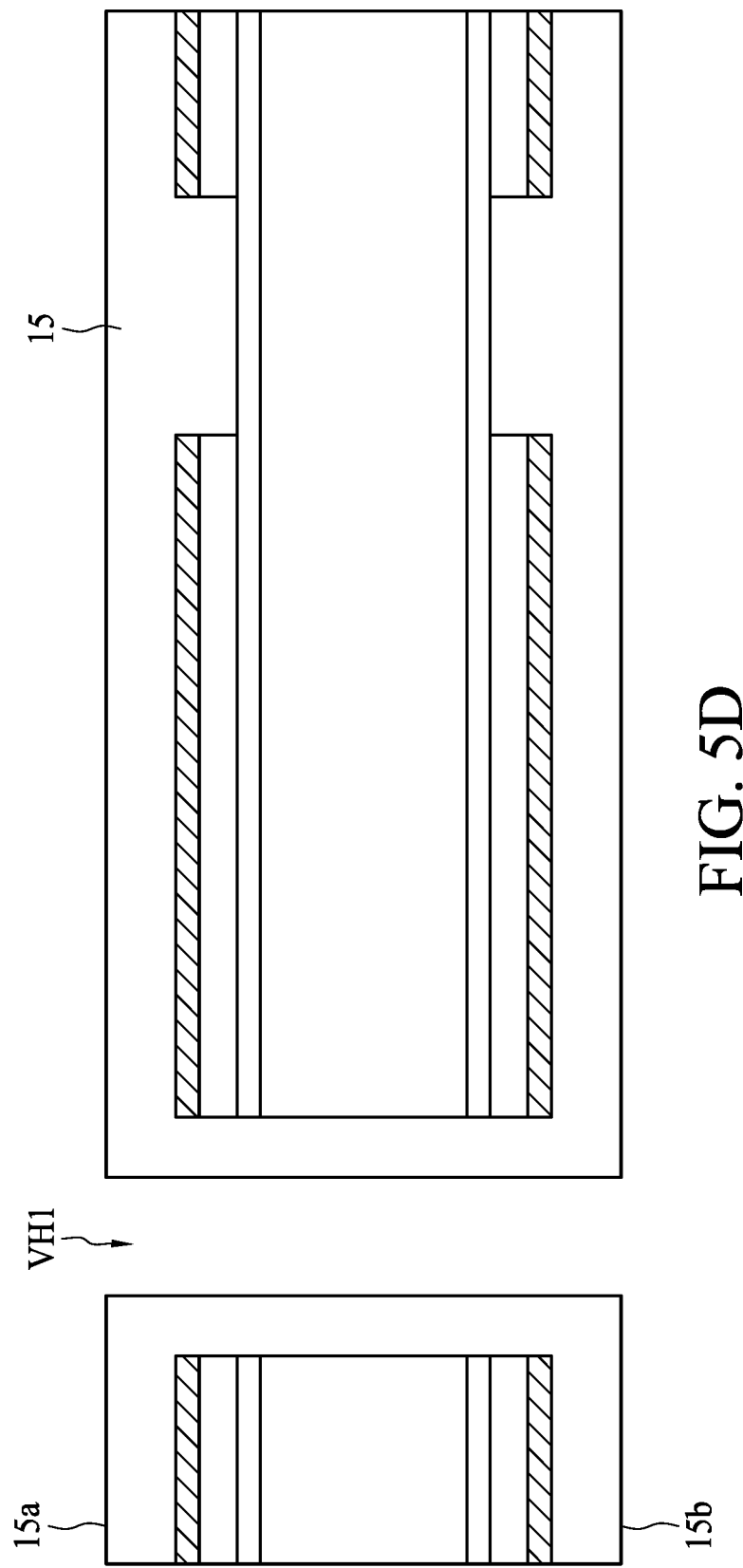

Referring to FIG. 5D, a via hole VH1 is formed in the opening H1 and penetrating from a top surface 15a of the dielectric layer 15 to a bottom surface 15b of the dielectric layer 15. The via hole VH1 may be formed by mechanical drilling, laser drilling, or other techniques.

Figure 5E:
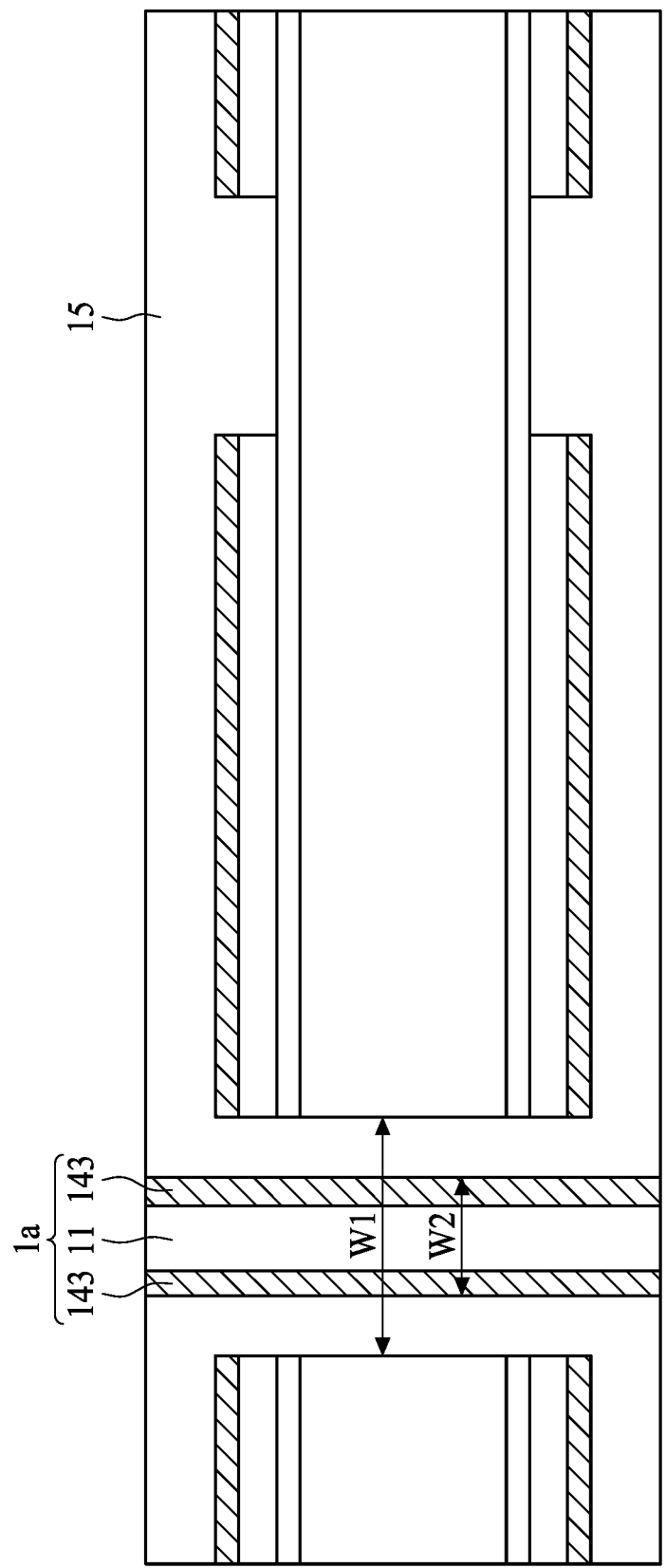

Referring to FIG. 5E, a conductive member 1a is formed in the via hole VH1. The conductive member 1a includes a metal layer 143 and a dielectric layer 11. The conductive member 1a is electrically isolated from the metal layer 10 by the dielectric layer 15. The dielectric layer 11 fills a center of the conductive member 1a and is surrounded by the metal layer 143. The conductive member 1a may be formed, for example, by electroplating or electroless plating the metal layer 143 on a lateral surface of the via hole VH1 and then filling a dielectric material into the remaining space to from the dielectric layer 11. The width W2 of the conductive member 1a may be equal to or less than 300 µm, equal to or less than 200 µm, equal to or less than 100 µm.

Compared to comparative embodiments, in the capacitor structure according to the embodiments of the present disclosure smaller opening H1 and via hole VH1 can be formed and therefore the resulting conductive member 1a has a reduced diameter, which allows for a larger surface area of the metal layer 10 and an enhanced capacitance.

Figure 5F:
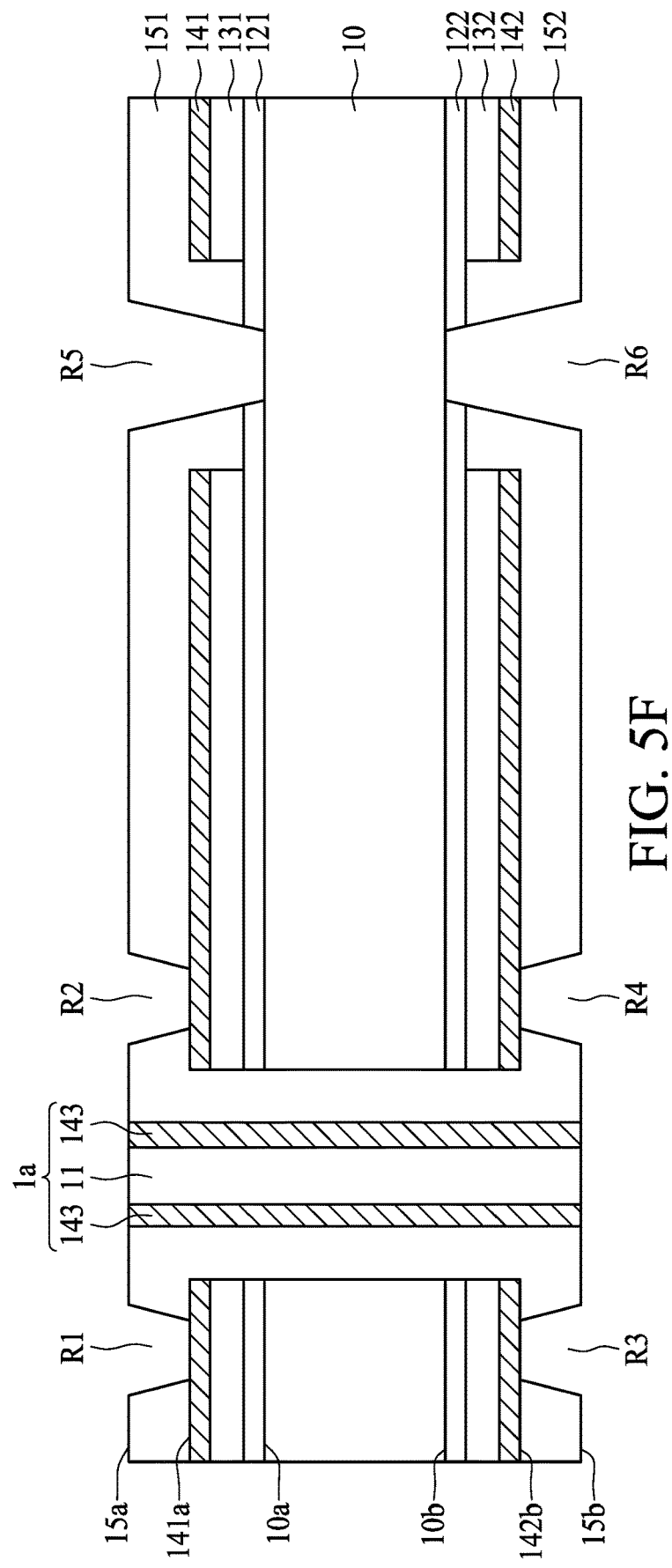

Referring to FIG. 5F, recesses R1 and R2 are formed in the dielectric layer 15 to expose the top surface 141a of the metal layer 141. Recesses R3 and R4 are formed in the dielectric layer 15 to expose the bottom surface 142b of the metal layer 142. In some embodiments, the recesses R1 and R3 are arranged on the left side of the conductive member 1a and the recesses R2 and R4 are arranged on the right side of conductive member 1a. In some embodiments, the recess R1 may be aligned with the recess R3 and the recess R2 may be aligned with the recess R4. Recesses R5 and R6 are formed in the openings O1 and O2 respectively. The recesses R5 and R6 penetrate through the dielectric layer 15 located in the openings O1 and O2 and the underlying metal oxide layer 122 to expose surface 10a of the metal layer 10.

The recesses R1, R2, R3, R4, R5 and R6 may also be referred to as openings, via holes, or blind via holes.

Figure 5G:
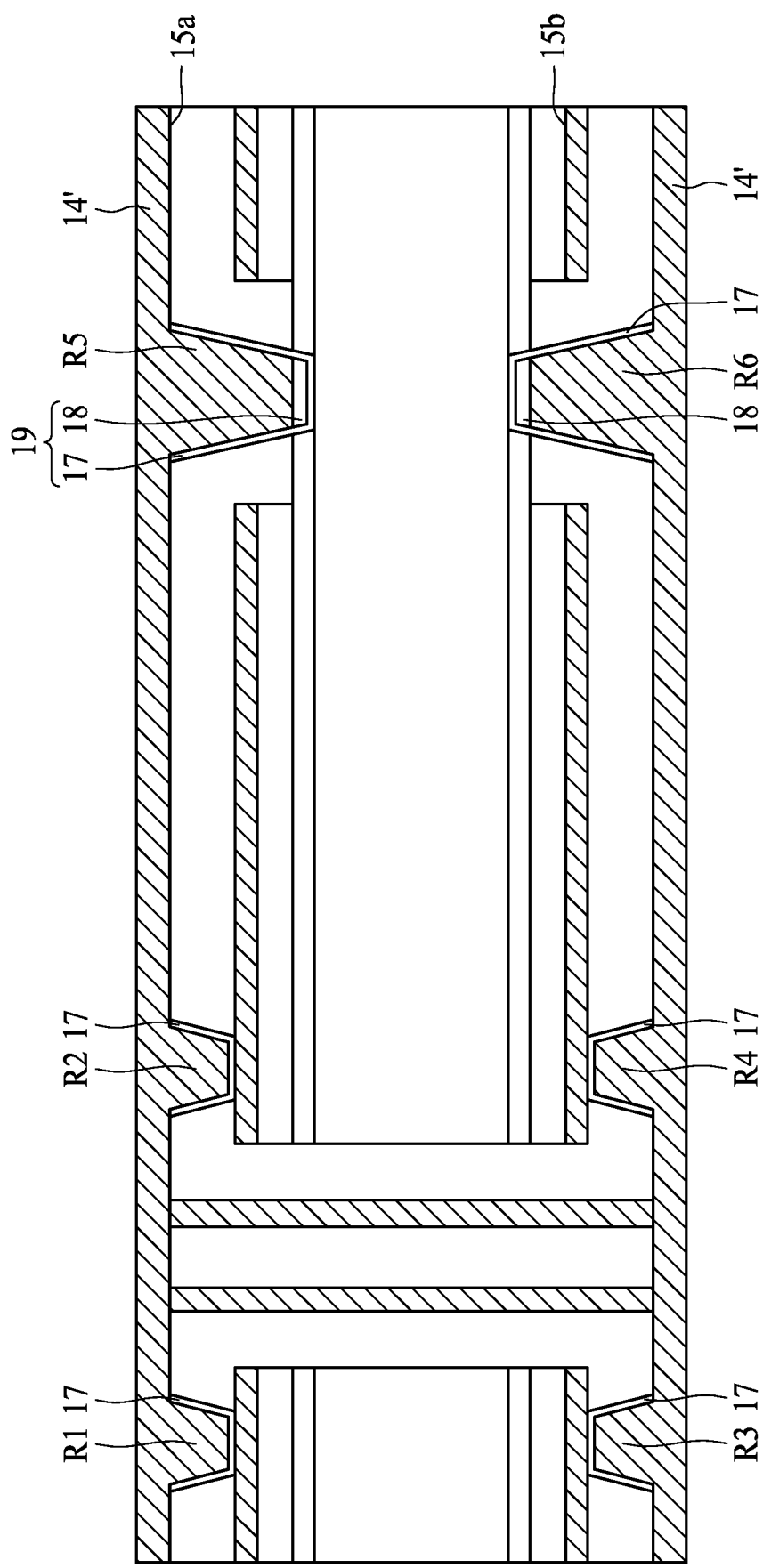

Referring to FIG. 5G, seed layers 17 are formed in the recesses R1, R2, R3, R4, R5 and R6, for example, by physical vapor deposition or other techniques. Barrier layers 18 are formed in the recesses R5 and R6. Barrier layers 18 are formed on the seed layer 17, for example, by electroless plating or other techniques. A metal layer 14' is formed on the surface 15a and fills the recesses R1, R2 and R5. Another metal layer 14' is formed on the surface 15b and fills the recesses R3, R4 and R6. The metal layer 14' may be formed, for example, by electroplating, electroless plating or other techniques.

Figure 5H:
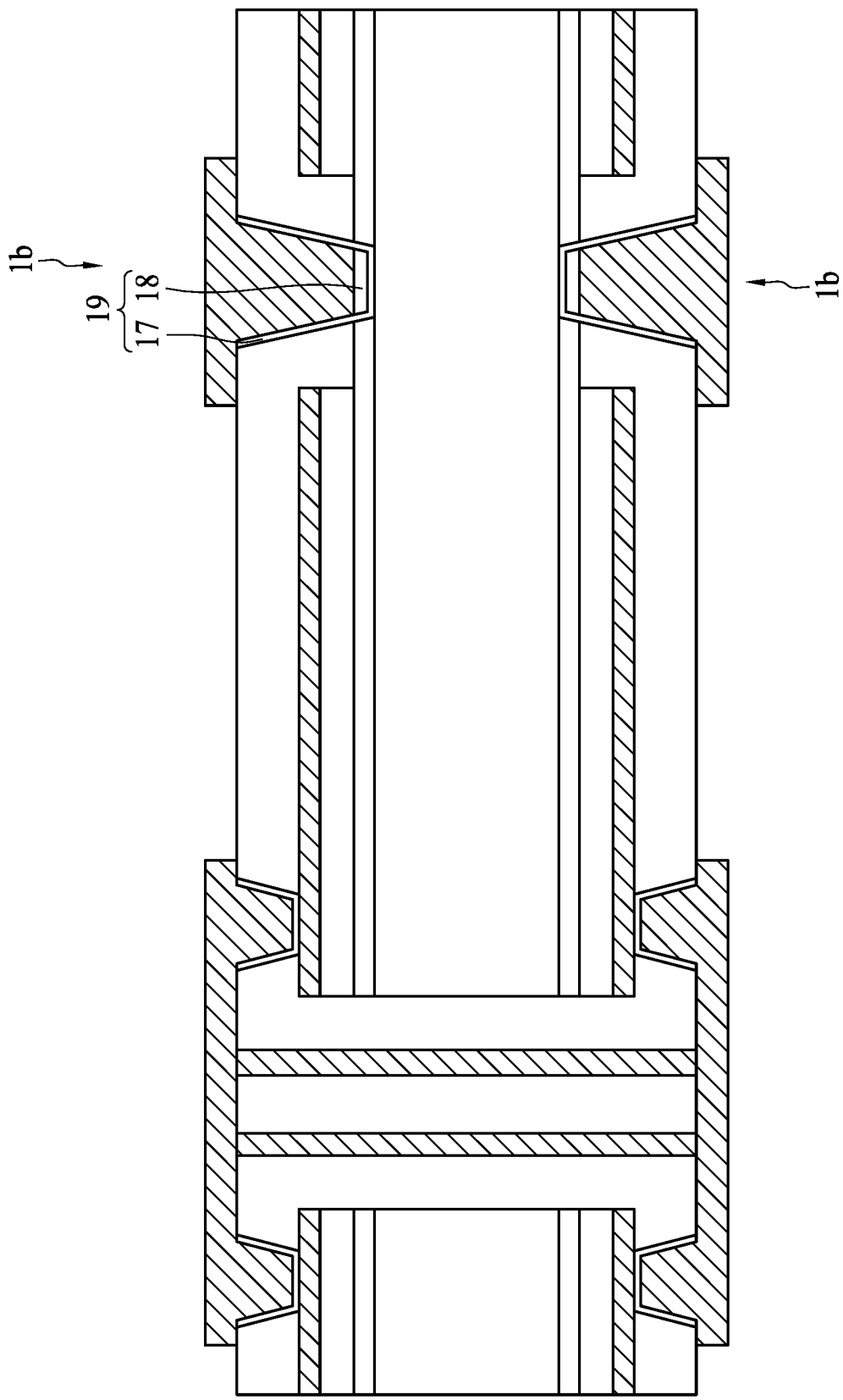

Referring to FIG. 5H, some parts of the metal layer 14' (denoted in FIG. 5G) are removed, for example, by etching techniques. A conductive member 1b is formed as shown in FIG. 6H. The conductive member 1b is electrically connected to the metal layer 10 by the metal composite structure 19.

FIG. 5A, FIG. 5B, FIG. 5C, FIG. 5D, FIG. 5E, FIG. 6A, FIG. 6B, FIG. 6C, FIG. 6D, FIG. 6E, FIG. 6F and FIG. 6G illustrate a method of manufacturing the semiconductor device package 4 as shown in FIG. 4.

FIG. 6A follows the operation as shown in FIG. 5E. Referring to FIG. 6A, an opening H2 is formed to penetrate through the structure as shown in FIG. 5E along the openings O1 and O2. The opening H2 penetrates through the dielectric layer 15, the metal oxide layer 121 and 122 and the metal 10. The opening H2 exposes a lateral surface of the metal layer 10. The exposed surface of the metal layer 10 may react with oxygen and form metal oxides. Therefore, after forming the opening H2, metal oxides are removed from the exposed surface of the metal layer 10 by a desmear process using strong acid, such as nitric acid or hydrochloric acid. After the desmear process, a recess R is formed in the exposed surface of the metal layer 10.

Figure 6B:
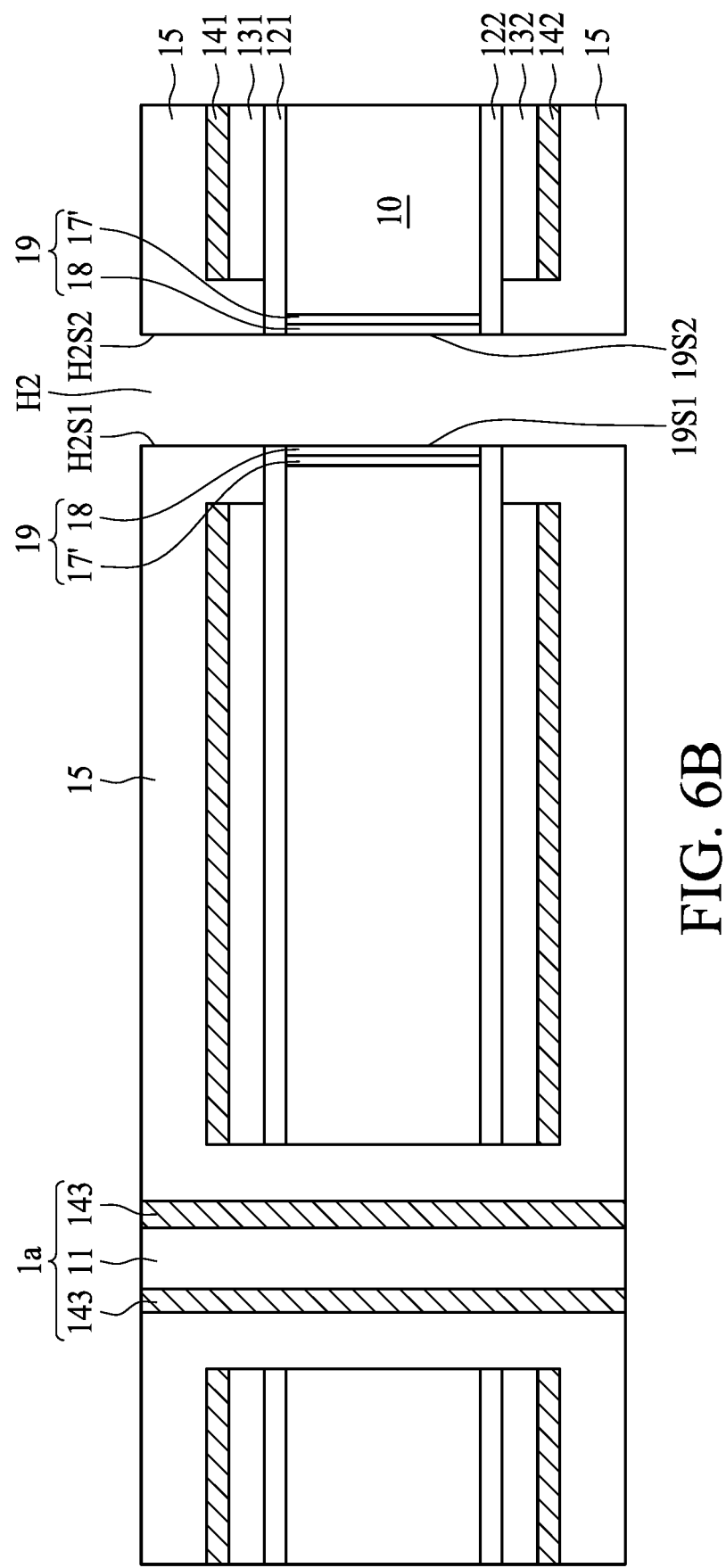

Referring to FIG. 6B, a metal composite structure 19 is formed in the recess R. The metal composite structure 19 includes a metal adhesive layer 17' and a barrier layer 18. The metal adhesive layer 17' is formed in the recess R. The barrier layer 18 is formed on the metal adhesive layer 17' in the recess R. A surface 19S1 (or 19S2) of the barrier layer 18 is coplanar with side surface H2S1 (or H2S2) of the opening H2. The metal adhesive layer 17' may be formed by electroless plating or other techniques. The barrier layer 18 may be formed by electroless plating or other techniques.

Figure 6C:
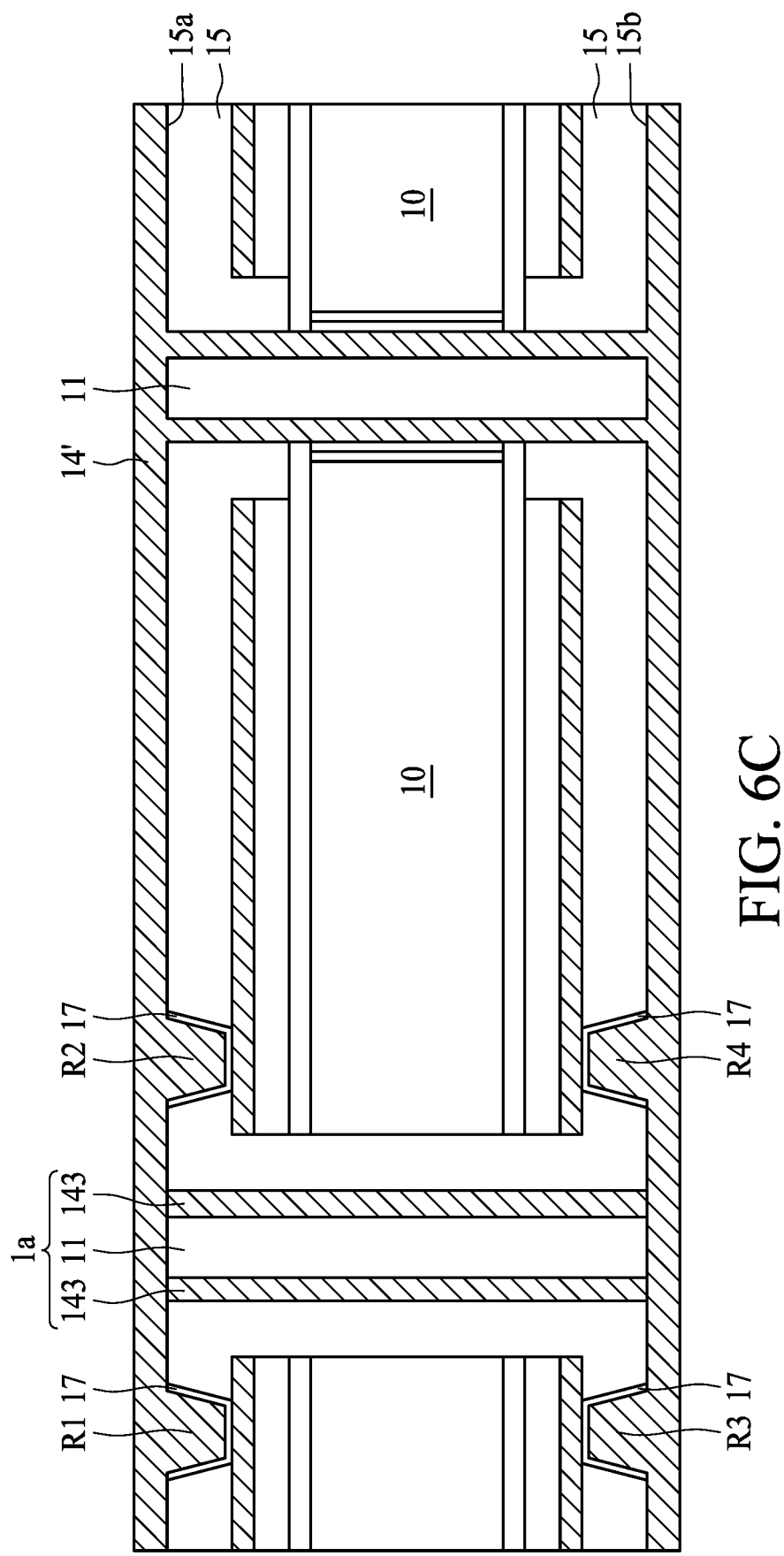

Referring to FIG. 6C, a metal layer 14' is formed on the surface 15b of the dielectric layer 15, the side surface (including, H2S1, H2S2) of the opening H2 and the surface (including, 19S1, 19S2) of the barrier layer 18, and fills the recesses R3 and R4. A dielectric material fills into the remaining space of the opening H2 to from the dielectric layer 11. The metal layer 14' is formed on the surface 15a and fills the recesses R1 and R2. A seed layer 17 is formed in the recesses R1, R2, R3, and R4 before the formation of the metal layer 14'.

Figure 6D:
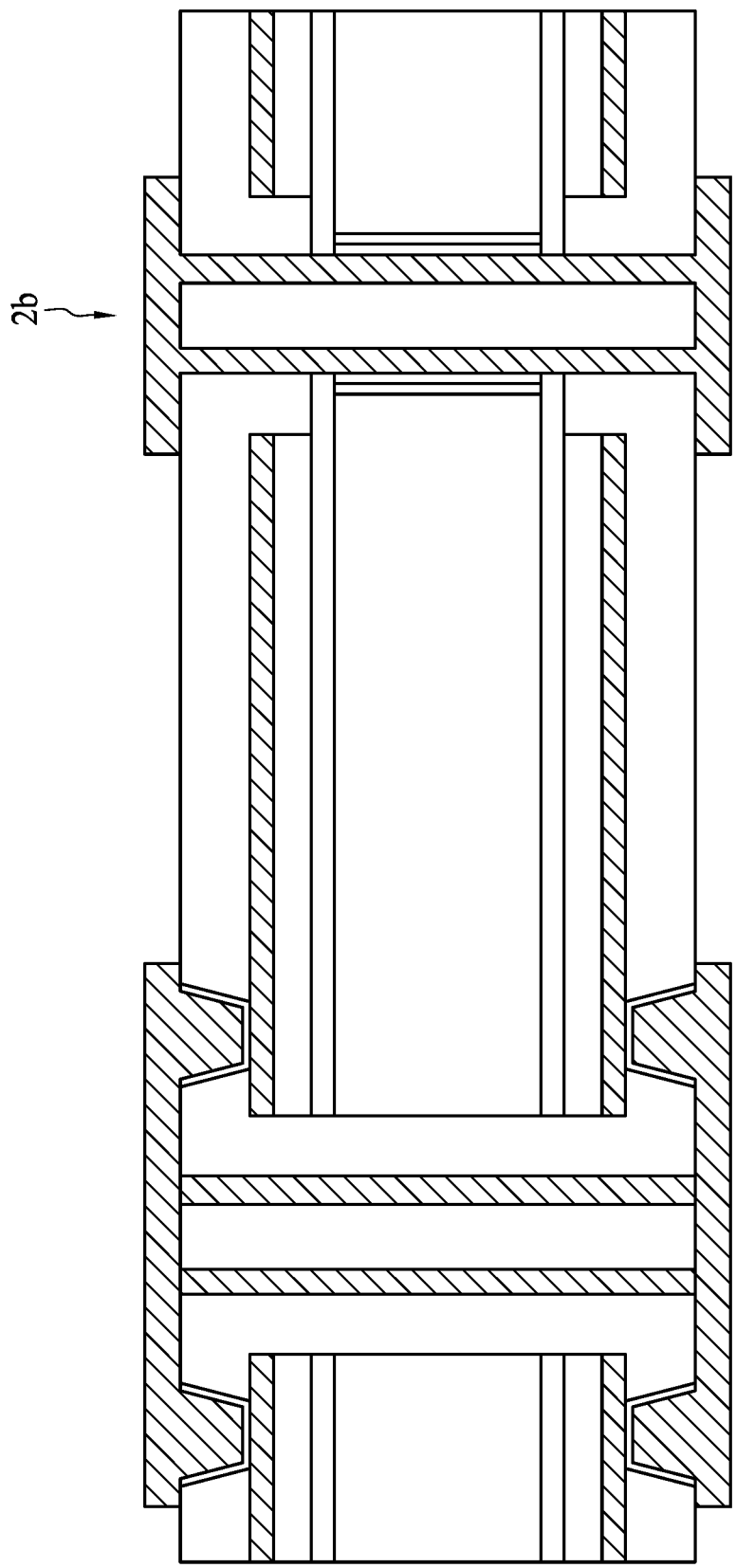

Referring to FIG. 6D, some parts of the metal layer 14' (denoted in FIG. 6C) are removed, for example, by etching techniques. A conductive member 2b is formed as shown in FIG. 6D. The conductive member 2b is electrically connected to the metal layer 10 by the metal composite structure 19.

Figure 6E:
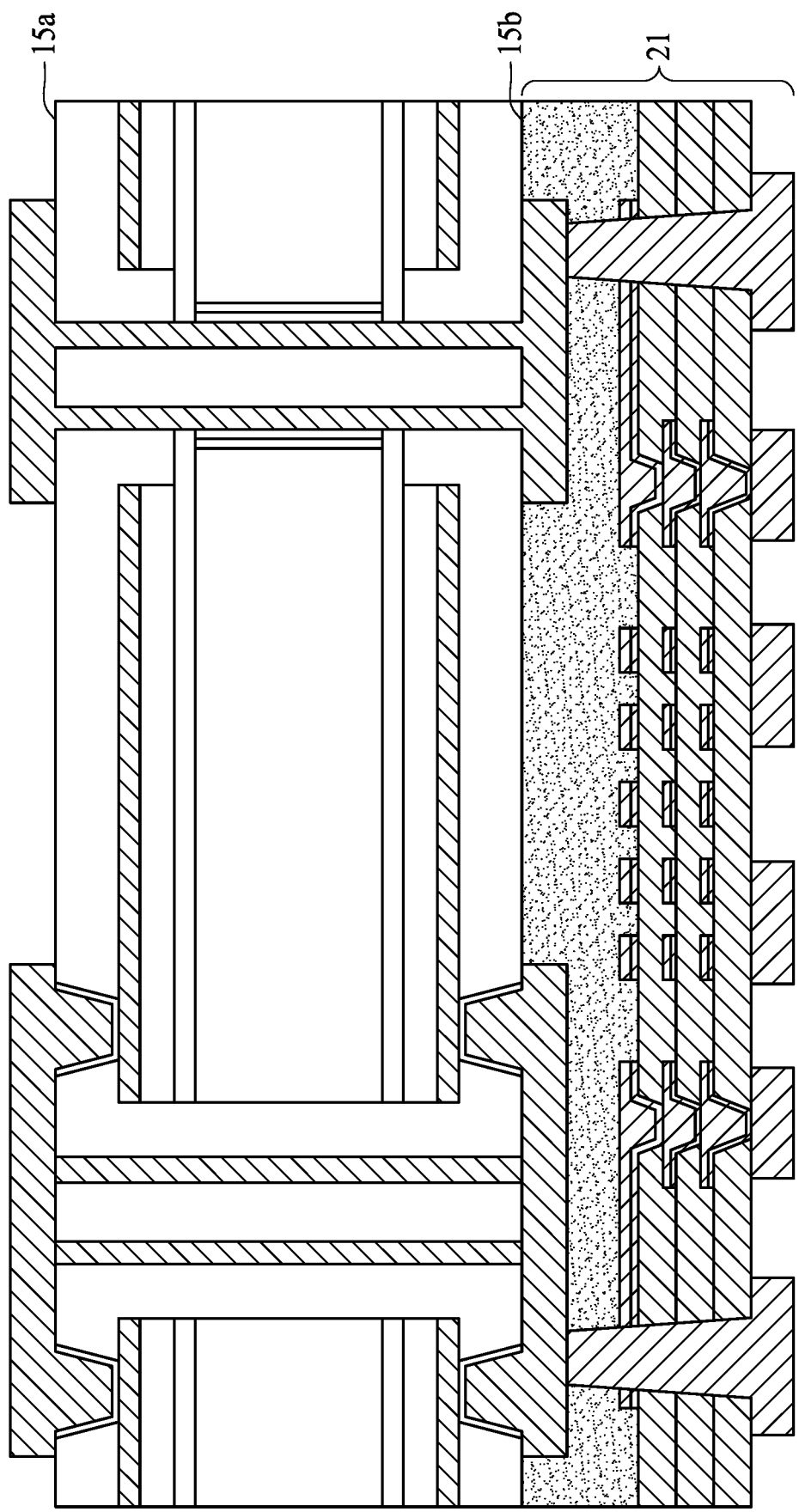

FIG. 6E illustrates that the capacitor structure as shown in FIG. 6D is disposed on an RDL structure 21.

Figure 6F:
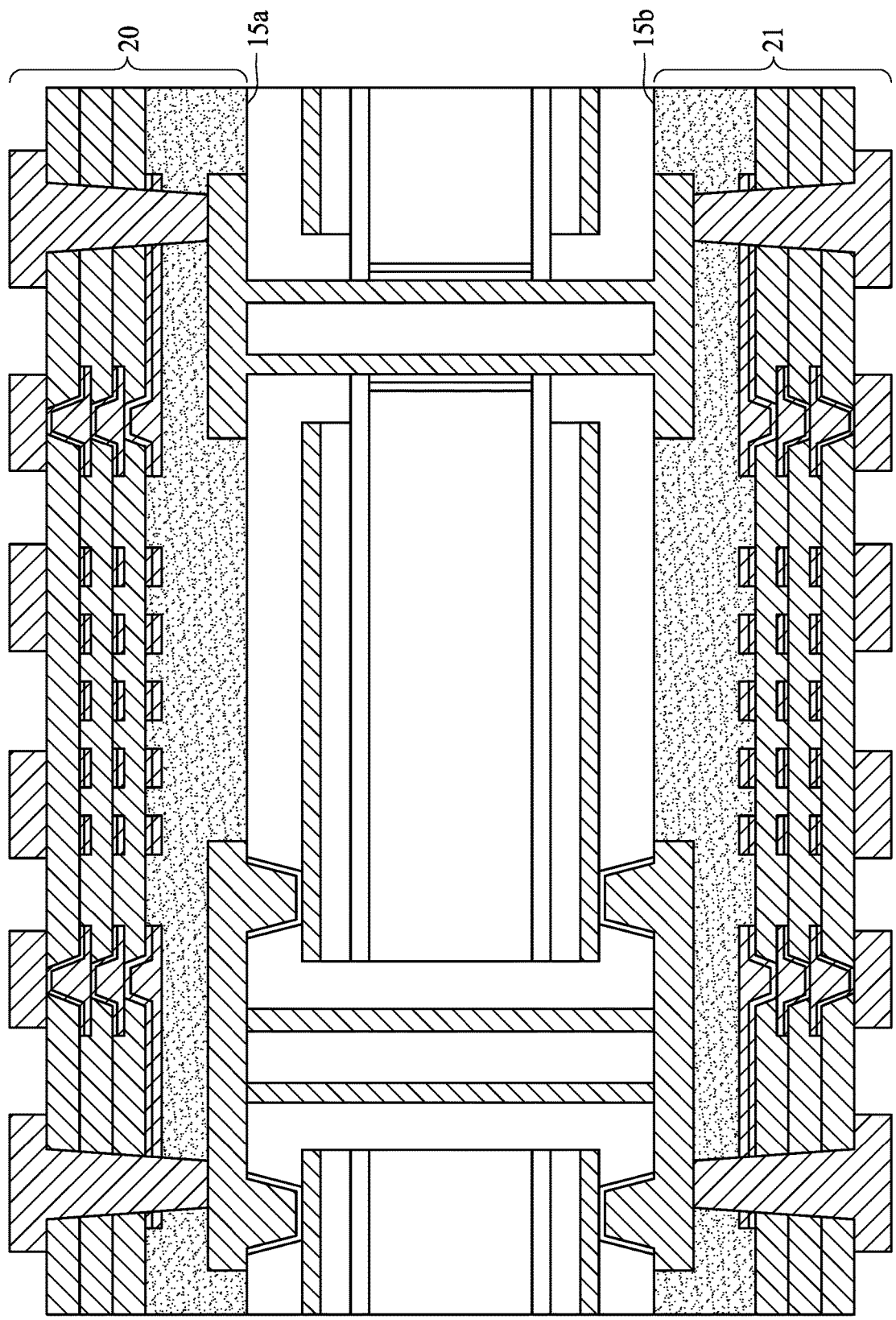

FIG. 6F illustrates that an RDL 20 structure is disposed on the structure as shown in FIG. 6E.

Figure 6G:
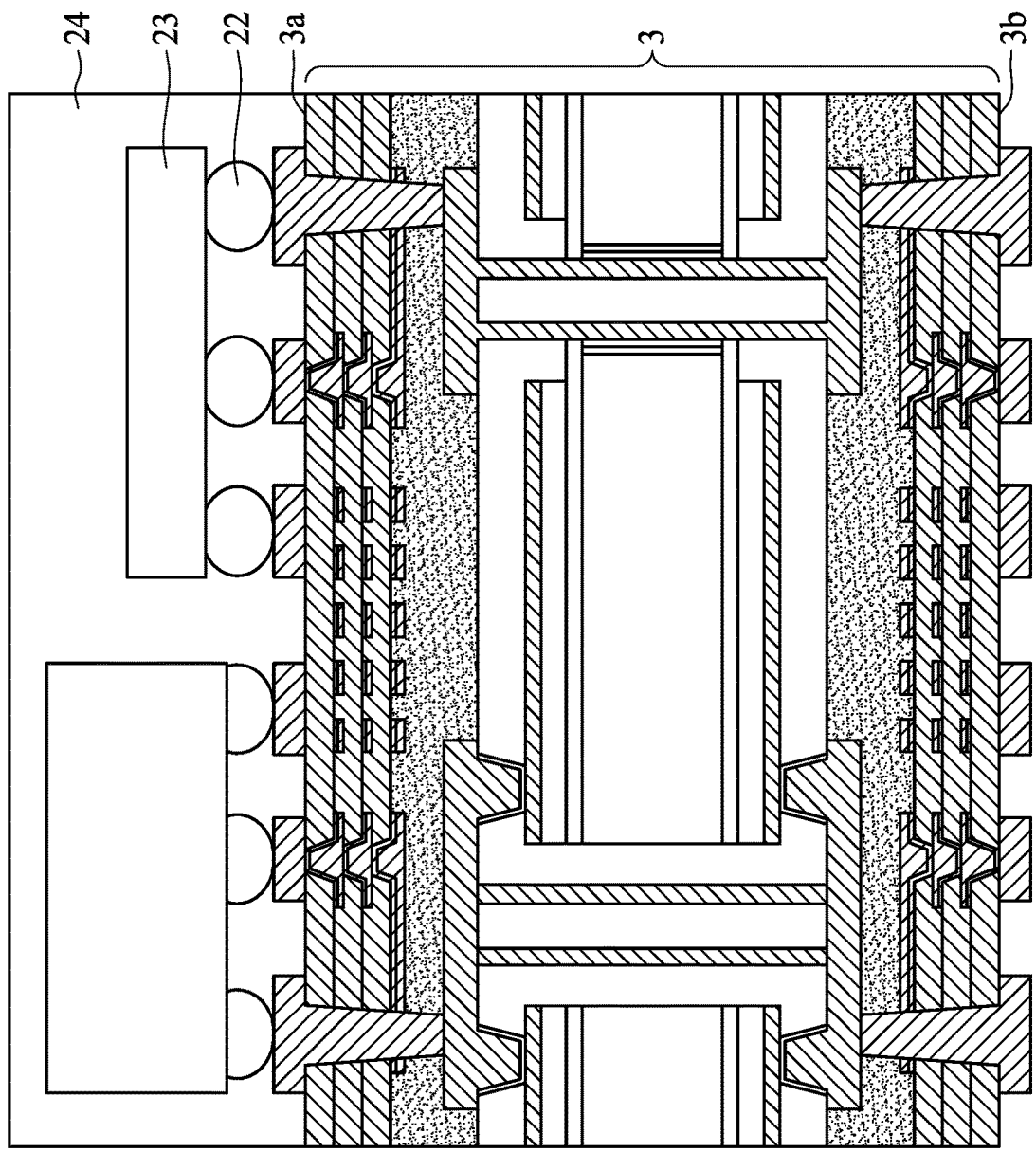

FIG. 6G illustrates a cross-sectional view of a semiconductor device package according to some embodiments of the present disclosure. A bump 22 is formed on the structure as shown in FIG. 6F. A semiconductor device 23 is electrically connected to the bump 22. An encapsulant 24 encapsulates the semiconductor device 23 and the bump 22 and the top surface 3a.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A capacitor structure, comprising:
   a core layer, having a first surface and a second surface opposite the first surface;
   a first conductive member penetrating through the capacitor structure and substantially separated from the core layer; and
   a second conductive member electrically connected to the core layer, wherein the second conductive member penetrates through the capacitor structure,
   wherein the core layer further comprises:
   a first metal oxide layer at the first surface of the core layer; and
   a second metal oxide layer at the second surface of the core layer.

2. The capacitor structure of claim 1, wherein the first conductive member or the second conductive member has at least a pad disposed over the first metal oxide layer or the second metal oxide layer.

3. The capacitor structure of claim 1, further comprising:
   a metal composite structure disposed between the second conductive member and the core layer.

4. The capacitor structure of claim 3, wherein the metal composite structure comprises a metal adhesive layer and a barrier layer.

5. The capacitor structure of claim 1, wherein the first conductive member comprises a metal portion and a dielectric portion, and the dielectric portion is encapsulated by the metal portion.

6. The capacitor structure of claim 5, wherein the first conductive member and the core layer are separated by a dielectric layer.

7. The capacitor structure of claim 5, wherein the metal portion of the first conductive member has a first extended portion disposed on an upper surface of the capacitor structure and a second extended portion disposed on a lower surface of the capacitor structure.

8. A capacitor structure, comprising:
a core layer, having a first surface and a second surface opposite the first surface;
a first conductive member penetrating through the capacitor structure and substantially separated from the core layer; and
a second conductive member electrically connected to the core layer, wherein the second conductive member penetrates through the capacitor structure,
wherein the first conductive member and the second conductive member are separated by the core layer.

9. The capacitor structure of claim 8, wherein the first conductive member, the second conductive member and the core layer form a capacitor configured to electrically connect to outside the capacitor structure.

10. The capacitor structure of claim 9, wherein the first conductive member and the second conductive member are an anode and a cathode of the capacitor structure.

11. The capacitor structure of claim 1, wherein the core layer comprises at least two conductive layers and a dielectric layer laminated between the two conductive layers, wherein the first conductive member and the second conductive member penetrate through the core layer.

12. A capacitor structure, comprising:
a core structure having a top surface and a bottom surface opposite the top surface; and
a first conductive member penetrating through and separated from the core structure, wherein the first conductive member comprises a metal layer and a dielectric layer, and wherein the metal layer of the first conductive member surrounds the dielectric layer of the first conductive member, wherein the core structure has a side surface extending from the top surface to the bottom surface of the core structure, and wherein a second conductive member penetrates through the core structure and is in contact with the side surface of the core structure.

13. The capacitor structure of claim 12, wherein the core structure further comprises a metal composite structure disposed between the second conductive member and the core structure.

14. The capacitor structure of claim 12, wherein the first conductive member is in contact with the top surface or the bottom surface of the core structure.

15. The capacitor structure of claim 14, wherein the core structure comprises a conductive layer and the first conductive member is in contact with the conductive layer of the core structure.

16. The capacitor structure of claim 15, wherein the core structure further comprises a metal oxide layer, and wherein the conductive layer of the core structure is located between the first conductive member and the metal oxide layer of the core structure.

* * * * *